United States Patent [19]

Hurd et al.

[11] Patent Number: 5,168,229
[45] Date of Patent: Dec. 1, 1992

[54] MULTIDIMENSIONAL NMR SPECTROSCOPY USING SWITCHED ACQUISITION TIME GRADIENTS FOR MULTIPLE COHERENCE TRANSFER PATHWAY DETECTION

[75] Inventors: Ralph E. Hurd, Milpitas; Boban K. John, Fremont; Harris D. Plant, Salida, all of Calif.

[73] Assignee: General Electric Company, Waukesha, Wis.

[21] Appl. No.: 678,831

[22] Filed: Apr. 2, 1991

[51] Int. Cl.⁵ ............................................. G01R 33/20
[52] U.S. Cl. ................................... 324/309; 324/307
[58] Field of Search ............... 324/300, 307, 309, 314, 324/312; 128/653.2

[56] References Cited

U.S. PATENT DOCUMENTS

| | | | |
|---|---|---|---|
| 4,238,735 | 12/1980 | Muller | 324/310 |
| 4,510,449 | 4/1985 | Ernst et al. | 324/311 |
| 4,680,546 | 7/1987 | Dumoulin | 324/307 |
| 4,766,377 | 8/1988 | Ohuchi et al. | 324/309 |
| 4,789,832 | 12/1988 | Nagayama | 324/307 |
| 4,893,080 | 1/1990 | Luyten et al. | 324/307 |
| 4,972,147 | 11/1990 | Van Vaals | 324/307 |
| 5,045,790 | 9/1991 | Hall et al. | 324/307 |
| 5,077,524 | 12/1991 | Hurd et al. | 324/322 |
| 5,101,158 | 3/1992 | Hall et al. | 324/307 |

OTHER PUBLICATIONS

Keeler et al., "Comparison and Evaluation of Methods for 2 Dimensional NMR Spectra with Absorption Mode Lineshapes", Journal of Magnetic Resonance 63, 454–472 (1985).

Ernst et al., "Principles of Nuclear Magnetic Resonance in One and Two Dimensions", Claredon Press, Oxford (1987).

Hurd, "Gradient-Enhanced Spectroscopy", J. of Mag. Res. 87, 422–428 (1990).

Kessler et al., "Two Dimensional NMR Spectroscopy: Background and Overview of the Experiments", Angew. Chem. Int. Ed. Engl. 27 (1988) 490–536.

Hurd et al., "Gradient Enhanced Proton Detected Heteronuclear Multiple Quantum Coherence Spectroscopy", J. of Mag. Res. 91, 648–653 (1991).

Primary Examiner—Michael J. Tokar
Assistant Examiner—Raymond Y. Mah
Attorney, Agent, or Firm—Henry K. Woodward

[57] ABSTRACT

A signal function $S(t_1, t_2)$ is obtained from a plurality of coherence transfer pathways in a single acquisition by preparing a molecular system in a coherent non-equilibrium state, and alternately and sequentially detecting signals at individual sampling points, in $t_2$, from the plurality of coherence transfer pathways by using gradient refocusing of a new pathway after signal detection at a sampling point in another pathway. The gradient encoding and refocusing of coherence pathways can use inhomogeneous rf-pulses ($B_1$ gradients) or $B_0$ field gradients. The coherence transfer pathways can be sequentially selected in an arbitrary order.

12 Claims, 3 Drawing Sheets

MULTIDIMENSIONAL NMR SPECTROSCOPY USING SWITCHED ACQUISITION TIME GRADIENTS FOR MULTIPLE COHERENCE TRANSFER PATHWAY DETECTION

BACKGROUND OF THE INVENTION

This invention relates generally to magnetic resonance spectroscopy, and more particularly the invention relates to multidimensional NMR spectroscopy using switched acquisition time (SWAT) gradients for detecting multiple coherence transfer pathways following a single magnetic excitation sequence.

Nuclear magnetic resonance (NMR) spectroscopy is a method that is used to study the structure and dynamics of molecules. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils.

A general description of the principles of NMR is given by Ernst et al. in *Principles of Nuclear Magnetic Resonance in One and Two Dimensions,* Clarendon Press, Oxford 1987.

Briefly, a strong static magnetic field is employed to line up atoms whose nuclei have an odd number of protons and/or neutrons, that is, have spin angular momentum and a magnetic dipole moment. A second, rf, magnetic field, applied as a pulse transverse to the static magnetic field ($B_0$), is then used to pump energy into these nuclei, causing them to process relative to the static field ($B_0$), by a fixed tip angle for example, 90° or 180°. After excitation the nuclei gradually return to alignment with the static field and give up the energy in the form of weak but detectable free induction decay (FID). These FID signals are used by a computer to produce spectra.

The excitation frequency is defined by the Larmor relationship which states that the angular frequency $\omega_0$, of the procession of the nuclei is the product of the magnetic field, $B_0$, and the so-called magnetogyric ratio, $\gamma$, a fundamental physical constant for each nuclear species:

$$\omega_0 = B_0 \cdot \gamma$$

The angle of nuclear spin tip in response to an rf pulse excitation is proportional to the integral of the pulse over time.

Multidimensional NMR spectroscopy provides a method for studying the structure, dynamics, and reactions of molecules. The interaction between the magnetic moments of atomic nuclei and magnetic fields are a function of two or more frequency variables providing a signal function $S(\omega_1, \omega_2, \omega_3...)$ which contains detailed chemical information. The pulse sequence of a multidimensional NMR procedure includes preparation of the nuclear spins by interaction of the nuclear magnetic moments and applied magnetic fields, evolution of the magnetic moments over a time ($t_1$), magnetization transfer, between nuclei (e.g. hydrogen to carbon), and detection over a time ($t_2$). Signals from various coherence transfer pathways can be detected using a sequence of rf and gradient pulses for selection. Heretofore, a signal from a single pathway has been sampled at a plurality of points in time following excitation and evolution. The sampling of a plurality of coherence transfer pathways has required sequential rf excitations with a unique magnetic gradient sequence for each pathway, thus necessitating multiple acquisitions. Fourier transformation is utilized to analyze the detector signals.

In general, the effect of a pulsed magnetic field gradient on the nuclear spins can be understood by describing the state of the spin system in terms of density operators. The density operator $\rho(t)$ of the spin system at any time t can be classified according to the various coherence orders:

$$\rho(t) = p\Sigma \rho^p(t), \qquad [1]$$

where p represents the coherence order. The Hamiltonian of the system during the gradient pulse is predominantly from Zeeman contributions. Classification of the density operator into its various components is convenient, since the effect of a field gradient pulse of duration $\tau$ can be written as $$\rho^p(t-) \xrightarrow{\exp\{i\omega_z(r)F_z\tau\}} \exp\{-ip\omega_z(r)\tau\}\rho^p(t+) \qquad [2]$$

where $\rho(t-)$ and $(t+)$ are used to label the density operator before and after the gradient pulse, and $F_z$ is the z component of the total angular momentum. The Zeeman fields experienced by the various spins in the sample vary according to their spatial coordinates. It can be seen from equation [2] that the gradient pulse introduces a complex phase factor into the density operator component. This phase factor depends on the coherence order of the component and on the area of the gradient pulse. Essentially, the effect of the gradient pulse is to defocus the coherence by a controlled amount. Each of the coherence pathways can be thought to be "coherence order labeled" by the gradients. Selection of a particular pathway is then accomplished by applying a rephasing gradient pulse integral of $\omega^R{}_Z(r) \tau^R$, which transforms the density operator, described by $K\Sigma C_{kp}(^{-1})\exp\{-i\phi_k\}$ where k denotes a particular coherence pathway, $\phi_k$ is the phase dispersal, $c_k$ denotes all of the time dependence and $\rho^{(-1)}$ denotes the observable component corresponding to $p = -1$. The refocusing gradient transforms the density operator as shown:

$$\exp\{i\omega^R{}_Z(r)F_{z\tau}{}^R\}$$

$$\sum_k c_k \rho^{(-1)}\exp\{-i\phi_k\} \longrightarrow c_l\rho(-1) + \qquad [3]$$

$$\sum_{k \ne l} c_k \rho^{(-1)}\exp\{-i(\phi_k + \omega_z{}^R(r)\tau^p)\}$$

where l is the desired pathway. The first term on the right hand side of equation [3] corresponds to the pathway which has been exactly refocused and is hence observable, since $$\phi_{80} = -\omega^R{}_Z(r)\tau^R \qquad [4]$$

The second term denotes all the other pathways which are still defocused and are not observable.

Equation [2] describes the central property of all coherence transfer selection schemes. In conventional NMR, each coherence component accumulates phase factors during the various cycles of the phase cycle scheme. The receiver phase cycle is then determined such that only the desired pathway yields a signal. In an experiment where pulsed gradients are used, each of the gradient pulses contributes to the cumulative phase factors of the various coherence components. The desired pathway can then be selected by choosing the area of the gradient prior to data acquisition, so that only the desired signal component is refocused. A major feature of gradient selection of coherence pathways is that the selection is accomplished in a single acquisition, unlike rf phase cycling, where multiple acquisitions are required. The major limitation of conventional gradient selection has been the loss of all but a single pathway, and hence usually the loss of the square root of 2 in signal to noise and loss of the potential for pure-absorption 2D line shapes.

SUMMARY OF THE INVENTION

An object of the invention is a multidimensional spectroscopy method and NMR apparatus for encoding and detecting signals from multiple coherence transfer pathways in a single acquisition sequence, in an easily separable fashion.

Briefly, the spin system of a sample is prepared in a coherent non-equilibrium state as in conventional multidimensional NMR spectroscopy using a single pulse sequence. Thereafter, a plurality of coherence transfer pathways are alternately and repetitively selected and sampled by switching acquisition time gradients in a single NMR acquisition. Fourier analysis of the signals acquired from the plurality of coherence transfer pathways can then be used in constructing a multidimensional spectrum map on the spin system.

More particularly, by switching acquisition time gradients, either the $B_0$ field gradients or rf gradients, each pathway can be individually refocused between sampling points and digitized during acquisition of the detected signals. Thus, in the course of a time period equal to the normal sampling interval, signals arising from all of the desired coherence pathways are individually encoded and detected. For detection of multiple pathways, the signal digitizer has to be run at a rate faster than for a normal acquisition. Selection of n different coherence pathways requires the digitizer to operate with a dwell time dw/n when dw represents the dwell time for a normal acquisition. The number of data points to be acquired will then be n times larger than the data points for a normal acquisition.

The invention and objects and features thereof will be more readily apparent from the following detailed description and appended claims when taken with the drawings

DETAILED DESCRIPTION OF ILLUSTRATIVE EMBODIMENTS

Figure 1A:
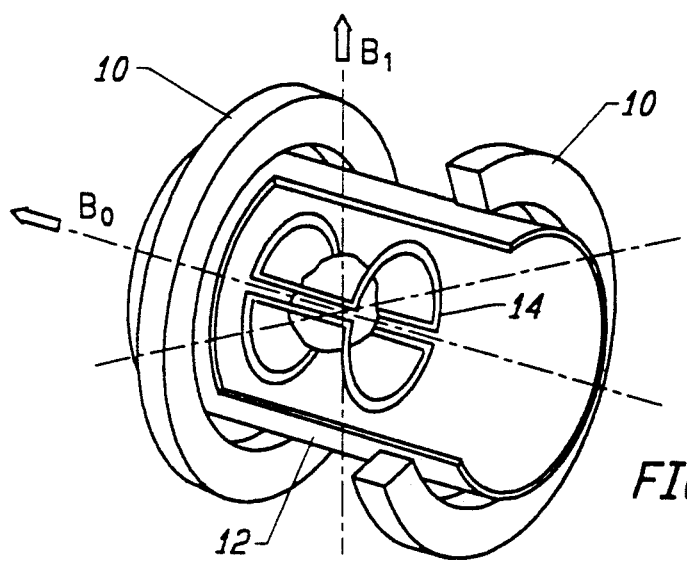
FIGS. 1A-1D illustrate the arrangement of conventional NMR apparatus and magnetic fields generated therein.

Referring now to the drawings, FIG. 1A is a perspective view partially in section illustrating coil apparatus in an NMR system, and FIGS. 1B-2D illustrate field gradients which can be produced in the apparatus of FIG. 1A. This apparatus is discussed in Hinshaw and Lent, "An Introduction to NMR Imaging: From the Bloch Equation to the Imaging Equation," Proceedings of the IEEE, Vol. 71, No. 3, Mar. 1983, pp. 338-350. Briefly, the uniform static field $B_0$ is gene magnet comprising the coil pair 10. A gradient field G(x) is generated by a complex gradient coil set which can be wound on the cylinder 12. An rf field B is generated by an rf coil 14. A sample being studied would be positioned along the Z axis within the rf coil 14.

Figures 1B, 1C, 1D:
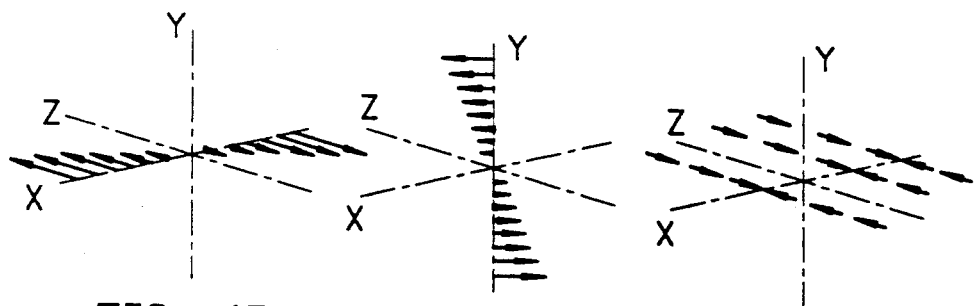

In FIG. 1B an X gradient field is shown which is perpendicular to the static field $B_0$ and varies linearly with distance along the X axis but does not vary with distance along the Y or Z axes. FIGS. 1C and 1D are similar representations of the Y gradient and Z gradient fields, respectively.

Figure 2:
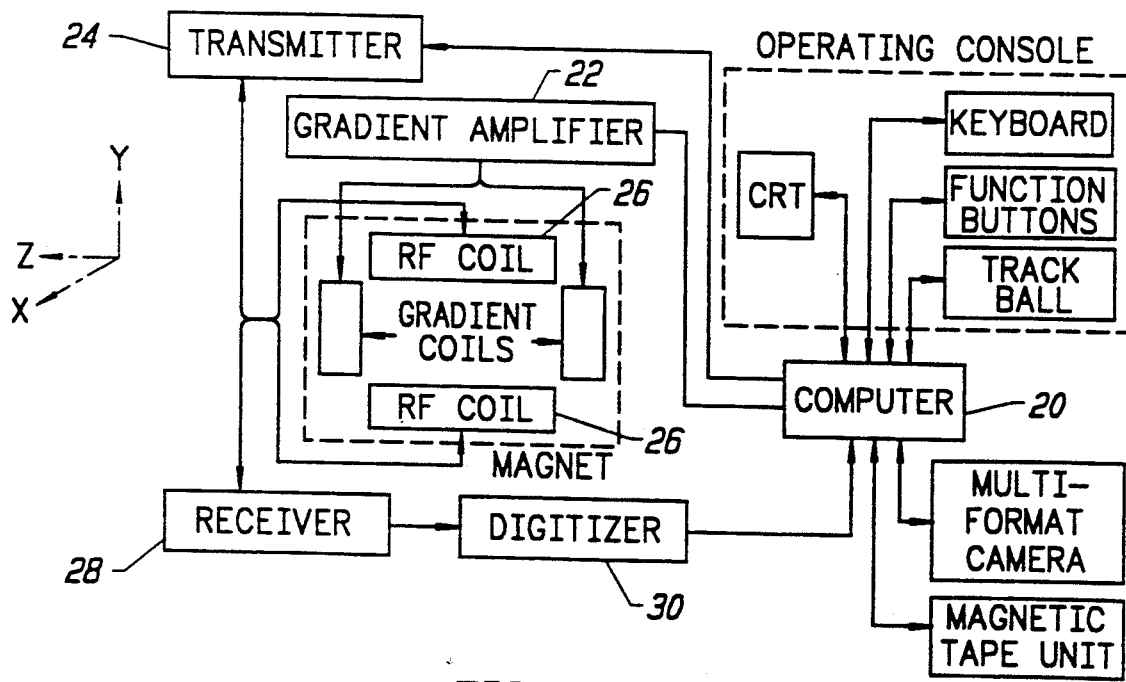
FIG. 2 is a functional block diagram of NMR and spectroscopy apparatus.

FIG. 2 is a functional block diagram of the NMR apparatus as disclosed in NMR-A Perspective on Imaging, General Electric Company, 1982. A computer 20 is programmed to control the operation of the NMR apparatus and process FID signals detected therefrom. The gradient field is energized by a gradient amplifier 22, and the rf coils for generating $B_1$ field at the Larmor frequency are controlled by the transmitter 24 and the rf coils 26. After the selected nuclei have been excited, the rf coils 26 are employed to detect the FID signal which is passed to the receiver 28 and thence through digitizer 30 for processing computer 20.

As noted above, in multidimensional Fourier spectroscopy the properties of a molecular system are characterized through acquisition and analysis of a signal. For example, in two dimensional NMR, the signal is a function $S(\omega_1, \omega_2)$ of two independent variables. A time domain signal $S(t_1, t_2)$ is measured as a function of two independent time variables and is converted by 2D Fourier transformation into the 2D frequency domain spectrum $S(\omega_1, \omega_2)$ The signal $S(t_1, t_2)$ can be obtained by incrementing the time interval $t_1$ and recording the NMR signal as a function of $t_2$.

The spin system is first prepared in a coherent non-equilibrium state by using one or more rf pulses. The spin system then evolves which determines the frequencies in the $\omega_1$-domain. The detected signal can arise from multiple coherence transfer pathways which conventionally are individually selected by applying rephasing gradient pulses for the selected pathway.

Figure 3A:
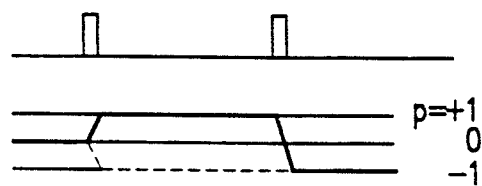
FIGS. 3A and 3B illustrate coherence transfer pathways for single-quantum coherence and double-quantum coherence respectively.
Figure 3B:
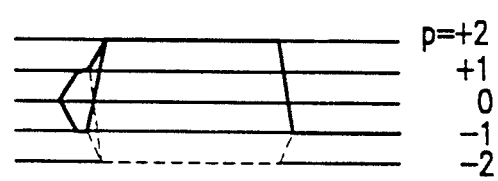

FIGS. 3A and 3B illustrate coherence transfer pathways for single-quantum coherence and double-quantum coherence, respectively. As described by Ernst et al. supra, page 294, in homo-nuclear 2D correlation spectroscopy, the preparation period (e.g. a single $\pi/2$ pulse) excites single-quantum coherence of orders $p = \pm 1$ which are transferred into observable coherence (p = −1) by a mixing propagator or single rf pulse. In double-quantum spectroscopy, the preparation propagator can be a series of pulses which excite coherence of order p= ±2, which are converted into observable p= −1 coherence by a suitable mixing propagator.

Figure 4A:
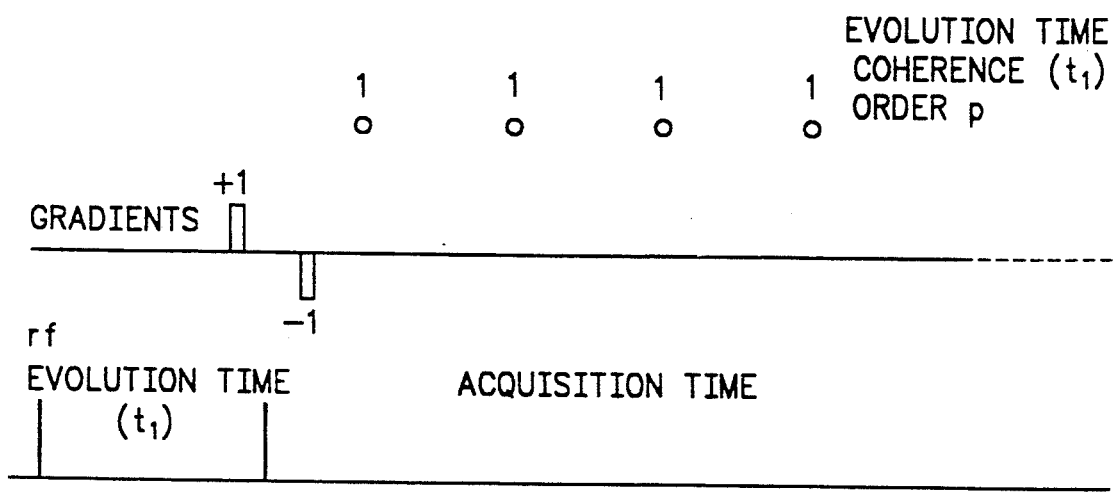
FIGS. 4A and 4B illustrate the acquisition of data in two coherence transfer pathways in accordance with the prior art.
Figure 4B:
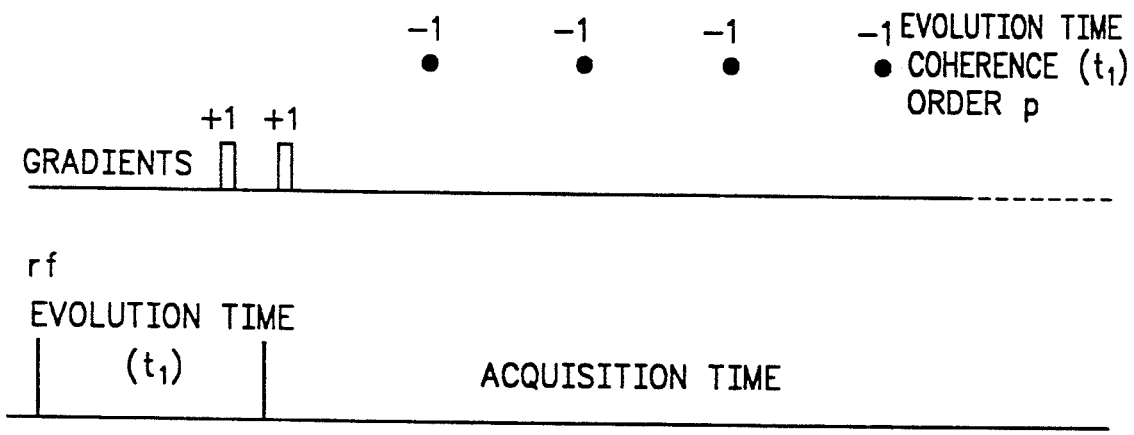

FIGS. 4A and 4B illustrate conventional acquisition of data using gradients to obtain two transfer pathways, corresponding to p= ±1, shown in FIG. 3A. Two separate data acquisition sequences are employed, first to obtain data at data points (illustrated by circles) in FIG. 4A following excitation and the application of a gradient for selecting the p= +1 coherence transfer pathway, and then in a separate acquisition to obtain data at data points (illustrated by dots) in FIG. 4B following excitation and the application of a gradient for selecting the p= −1 coherence transfer pathway. Relative gradient values of +1 and −1 are used for illustration purposes.

Figure 5:
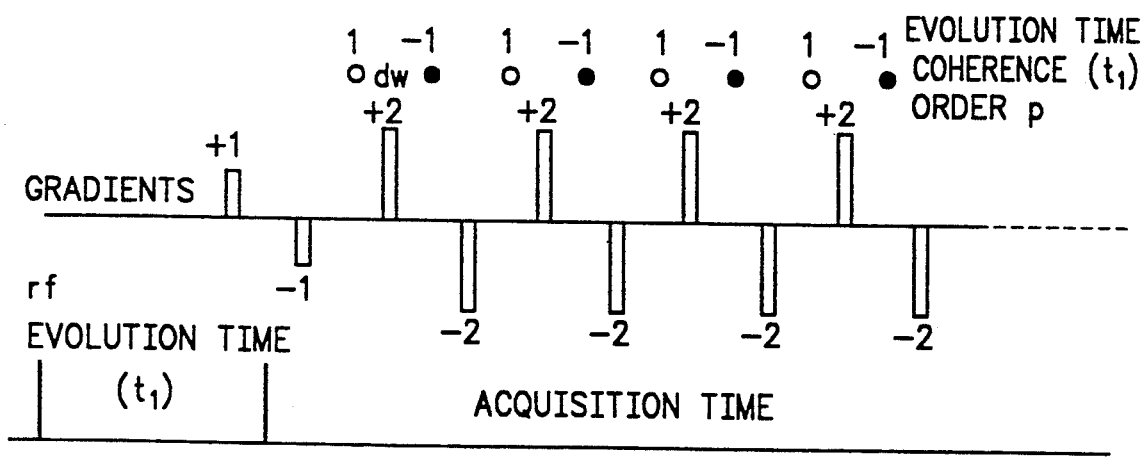
FIG. 5 illustrates the acquisition of data in two coherence transfer pathways in accordance with the invention.

In accordance with the invention, the data for all data points from all pathways in FIGS. 4A, 4B are obtained in a single acquisition as illustrated in FIG. 5. In this embodiment for two coherence transfer pathways, the pathway selection gradients or acquisition time gradients are switched to encode and detect both pathways during a single NMR acquisition. Following data acquisition at a data point for one pathway, the acquisition gradient is effectively altered to select a data point from the other coherence transfer pathway.

Accordingly, by gradient refocusing of each pathway in turn between digitizer sampling points, signals from both coherence pathways are individually encoded and detected in the course of a time period equal to the time period for a single pathway as in the prior art of FIGS. 3A, 3B.

Figure 6:
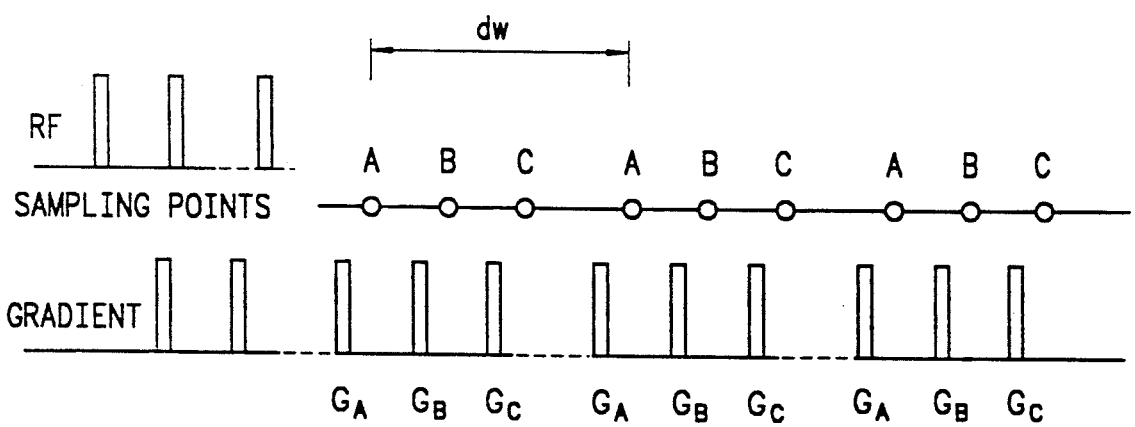
FIG. 6 illustrates the acquisition of data for the selection of three coherence transfer pathways in accordance with the invention.

FIG. 6 illustrates the acquisition of data in a set of three coherence transfer pathways in accordance with the invention. In each embodiment, the selection of multiple pathways requires the digitizer to be operated with a shorter dwell time than in a conventional acquisition in a single pathway.

The switched acquisition time gradient pulse train technique of the invention makes detection of signals from multiple pathways in a single acquisition possible by gradient refocusing of each pathway in turn between digitizer sampling points and acquisition of the corresponding signals. Thus, in the course of a time period equal to the normal sampling interval signals arising from all of the desired coherence pathways are individually encoded and detected. The relative area of the SWAT gradient pulse train is determined by the coherence pathway that is to be refocused. For detection of multiple pathways, the digitizer has to be run at a rate faster than for a normal acquisition. As noted above, selection of n different coherence pathways requires the digitizer to be operated with a dwell time dw/n where dw represents the dwell time for a normal acquisition. The number of data points to be acquired will then be n times larger than is appropriate for a normal acquisition.

The method is of general utility as it provides a means for acquiring signal components from multiple coherence pathways using a single acquisition. Data points corresponding to each of the pathways can be easily separated using simple data sorting techniques. Only a single acquisition is necessary for coherence pathway selection and multiple coherence pathways are obtained in an easily separable (sortable) fashion. The invention can select data from a arbitrary set of coherence pathways.

While the invention has been described with reference to a specific embodiment, the description is illustrative of the invention and is not to be construed as limiting the invention. For example, the invention provides a basis for phase sensitive multidimensional spectroscopy. The encoding and detecting of coherence transfer pathways can be in any arbitrary order. Various modifications and applications may occur to those skilled in the art without departing from the true spirit and scope of the invention as defined by the appended claims.

We claim:

1. In multidimensional spectroscopy of a molecular system, a method of detecting NMR data in a plurality of coherence transfer pathways in a single acquisition comprising the steps of
   a) placing said molecular system in a static magnetic field,
   b) applying a time sequence of rf and gradient pulses to said molecular system whereby spins are prepared in a coherent coherence-order-labeled non-equilibrium state,
   c) applying a focusing gradient to said molecular system for selecting a first coherence transfer pathway for detecting data,
   d) detecting data at a first data sampling point from said first coherence transfer pathway,
   e) applying a first refocusing gradient to said molecular system for selecting a second coherence transfer pathway,
   f) detecting data at a first data sampling point from said second coherence transfer pathway,
   g) applying a second refocusing gradient to said molecular system for selecting said first coherence transfer pathway,
   h) detecting data at a second data point in said first coherence transfer pathway, and
   i) repeating steps e) through h) for detecting data at other data sampling points in said first coherence transfer pathway and said second coherence transfer pathway.

2. The method as defined by claim 1 and further including after step f) the steps of applying at least one additional refocusing gradient for selecting at least a third coherence transfer pathway, and detecting data at a first data sampling point in said third coherence transfer pathway.

3. The method as defined by claim 1 wherein step c) and step e) cumulatively define a focusing gradient for said second coherence transfer pathway, and step c), step e), and step g) cumulatively define a focusing gradient for said first coherence transfer pathway.

4. The method as defined by claim 1 wherein steps c), e), and g) comprise applying $B_0$ field gradients.

5. The method as defined by claim 1 wherein steps c), e), and g) comprise applying inhomogeneous ($B_1$) rf pulses.

6. In multidimensional spectroscopy of a molecular system, a method of acquiring NMR signals from a plurality of coherence transfer pathways, said method including the steps of preparing said molecular system in a coherent non-equilibrium state, and alternately and sequentially detecting NMR signals at sampling points in said plurality of coherence transfer pathways using gradient refocusing to a pathway after signal detection in another pathway.

7. The method as defined by claim 6 wherein said step of alternately and sequentially detecting NMR signals includes encoding and detecting coherence transfer pathways in an arbitrary order.

8. The method as defined by claim 6 wherein said gradient refocusing employs rf ($B_1$) gradient pulses.

9. The method as defined by claim 6 wherein said gradient refocusing employs $B_0$ field gradients.

10. Apparatus for use in multidimensional spectroscopy comprising
   a) means for applying a static magnetic field ($B_0$) to a molecular system thereby aligning nuclear spins along an axis (z),
   b) means for applying rf ($B_1$) pulses to said molecular system whereby said molecular system is in a coherent non-equilibrium state,
   c) means for applying gradients to said molecular system whereby any one of a plurality of coherence transfer pathways can be selected, and
   d) means for alternately and sequentially detecting NMR signals at sampling points from said plurality of coherence transfer pathways.

11. Apparatus as defined by claim 10 wherein said means for applying gradients applies rf ($B_1$) gradients for refocusing a coherence transfer pathway after data sampling in another coherence transfer pathway.

12. Apparatus as defined by claim 10 wherein said means for applying gradients applies field ($B_0$) gradients for refocusing a coherence transfer pathway after data sampling in another coherence transfer pathway.

* * * * *